United States Patent
Miyazaki et al.

(10) Patent No.: US 6,541,176 B2
(45) Date of Patent: Apr. 1, 2003

(54) PROCESS FOR MAKING LITHOGRAPHIC PRINTING PLATE

(75) Inventors: Takashi Miyazaki, Tokyo (JP); Satoshi Shimonodan, Tokyo (JP); Etsuji Tanaka, Tokyo (JP); Motozo Yamano, Tokyo (JP)

(73) Assignee: Mitsubishi Paper Mills, Ltd., Tokyo (JP)

( * ) Notice: Subject to any disclaimer, the term of this patent is extended or adjusted under 35 U.S.C. 154(b) by 0 days.

(21) Appl. No.: 09/822,333

(22) Filed: Apr. 2, 2001

(65) Prior Publication Data

US 2003/0022096 A1 Jan. 30, 2003

(30) Foreign Application Priority Data

Mar. 20, 2000 (JP) ........................................ 2000-095591
Jun. 9, 2000 (JP) ........................................ 2000-172813

(51) Int. Cl.$^7$ ............................. G03C 8/06; G03C 1/36; G03C 1/14; G03C 1/10; G03F 7/07
(52) U.S. Cl. ........................ 430/204; 430/230; 430/510; 430/517; 430/519; 430/522; 430/570; 430/583; 430/591; 430/595; 430/606
(58) Field of Search ................................ 430/204, 230, 430/606, 595, 510, 517, 519, 522, 583, 591, 570

(56) References Cited

U.S. PATENT DOCUMENTS

| | | | | |
|---|---|---|---|---|
| 4,053,318 A | * | 10/1977 | Sato et al. | 430/591 |
| 4,175,965 A | * | 11/1979 | Yoshida et al. | 430/204 |
| 4,469,785 A | * | 9/1984 | Tanaka et al. | 430/591 |
| 4,621,041 A | * | 11/1986 | Saikawa et al. | 430/204 |
| 4,686,170 A | * | 8/1987 | Vermeulen et al. | 430/204 |
| 4,828,962 A | * | 5/1989 | Grzeskowiak et al. | 430/204 |
| 4,988,611 A | * | 1/1991 | Anderson et al. | 430/606 |
| 5,047,311 A | * | 9/1991 | Endo et al. | 430/204 |
| 5,691,129 A | * | 11/1997 | Fabricius et al. | 430/591 |
| 6,017,673 A | * | 1/2000 | Vanmaele et al. | 430/204 |
| 6,261,733 B1 | * | 7/2001 | Coppens et al. | 430/204 |

FOREIGN PATENT DOCUMENTS

| | | | |
|---|---|---|---|
| EP | 554.585 | * | 8/1993 |
| EP | 751432 | * | 1/1997 |

* cited by examiner

*Primary Examiner*—Richard L. Schilling
(74) *Attorney, Agent, or Firm*—Paul E. White, Jr.; Manelli Denison & Selter PLLC

(57) ABSTRACT

There is disclosed a process for making a lithographic printing plate, which comprises subjecting a lithographic printing material having at least a silver halide emulsion layer and a physical development nuclei layer on a support and having a sensitivity at a wavelength of 400 nm to 440 nm of 20 $\mu J/cm^2$ or less, and having substantially no sensitivity at a wavelength of 450 nm or longer to scanning exposure by a scanning type exposure device on which a violet laser diode is mounted, and then subjecting to developing treatment.

17 Claims, No Drawings

PROCESS FOR MAKING LITHOGRAPHIC PRINTING PLATE

BACKGROUND OF THE INVENTION

1. Field of the Invention

This invention relates to a process for making a lithographic printing plate, more specifically to a process for making a lithographic printing plate utilizing a silver complex diffusion transfer process and using a scanning type exposure device on which a violet laser diode is mounted (which is generally called to as "an image setter" or "a plate setter").

2. Prior Art

A lithographic printing plate using a silver complex diffusion transfer process (the DTR method) has already been known. On of which is a lithographic printing plate having a silver halide emulsion layer and a physical development nuclei layer on a support (for example, paper coated by a polyethylene resin, a polyethylene terephthalate film, etc.) in which order (hereinafter referred to as "a flexible lithographic printing plate"). Such a plate has been disclosed in, for example, U.S. Pat. Nos. 3,721,559, 3,490,905, 3,385,701, 3,814,603, 3,454,398, 3,764,323 and 3,099,209; Japanese Patent Publications No. 27242/1969 and No. 30562/1973; and Japanese Provisional Patent Publications No. 9603/1978, No. 21602/1978, No. 103104/1979 and No. 9750/1981.

The above-mentioned lithographic printing plate has a physical development nuclei layer on the surface of a silver halide emulsion layer in which gelatin is used as a binder, and silver halide crystals in the exposed silver halide emulsion layer causes chemical development by the DTR development to become black silver, and a non-image portion which is hydrophilic and mainly comprises a gelatin is formed. On the other hand, unexposed silver halide crystal becomes a silver complex by a silver complexing agent in a developing solution and diffuses to the physical development nuclei layer at the surface, and causes physical development in the presence of a nuclei to form an image portion mainly comprising a physical development silver which is ink-receptive.

Another type is a lithographic printing plate in which a silver halide emulsion layer is provided on a physical development nuclei carried on a roughened and anodized aluminum support (hereinafter referred to as "an aluminum lithographic printing plate"). This is described, for example, in Japanese Provisional Patent Publications No. 118244/1982, No. 158844/1982, No. 260491/1988, No. 116151/1991, No. 282295/1992, No. 216236/1993 and No. 81194/1994; and U.S. Pat. Nos. 4,567,131 and 5,427,889. In this lithographic printing plate, after developing treatment, the silver halide emulsion layer is subjected to wash off (removal by washing) after developing treatment, to appear an image portion comprising a metal silver membrane and a non-image portion comprising an aluminum anodized surface.

The above-mentioned two types of the lithographic printing plates are different in layer constitution, but they are common in forming an image silver by utilizing a silver complex diffusion transfer process. These lithographic printing plates are constituted by an image portion which accepts an oleophilic ink and a non-image portion which is hydrophilic and accepts water. Thus, in a usual lithographic printing, both of water (dampening solution) and ink are supplied on the lithographic plate, and the image portion accepts a coloring ink, and the non-image portion selectively accepts water, and printing is carried out by transferring the ink on the image portion to a paper for printing.

Also, in the lithographic printing plates utilizing the silver complex diffusion transfer process as mentioned above, it has been known a camera exposure type and a scanning exposure type. As the scanning exposure type lithographic printing plate, there are disclosed, for example, in U.S. Pat. Nos. 4,621,041 and 4,501,811; and Japanese Provisional Patent Publications No. 71055/1984, No. 71056/1984, No. 61752/1985, No. 75838/1985, No. 100148/1985, No. 179744/1985, No. 197737/1987, No. 197738/1987, No. 47756/1988, No. 68963/1988, No. 252863/1988, No. 13539/1989, No. 74241/1990, No. 251853/1990, No. 281708/1997, etc. As a light source for scanning exposure, it has generally been known a helium-neon laser, an argon laser, a semiconductor laser, a radiation diode, etc. The so-called CTP (computer to plate) system in which plate making is carried out by using these lithographic printing plates for scanning type exposure and a laser exposure machine (which is called to as "an image setter" or "a plate setter") to directly printing a digital image to a printing plate has rapidly spread in recent years.

However, handling of the plate making operation of the lithographic printing plate for the scanning type exposure as mentioned above must be carried out in a dark room so that there are problems in workability and safety. Accordingly, it has earnestly been desired to develop a CTP system which can handle in a bright room or under light safe light (under yellow fluorescent light).

In extremely recent years, a scanning type exposure device on which a violet laser diode having an oscillation wavelength at 400 to 430 nm is mounted has been developed and used. This exposure device has a shorter wavelength of a light source than the conventional exposure device as mentioned above so that it has merits that it is excellent in fine line reproducibility and has a rapid output rate. However, a lithographic printing plate having a practically usable sensitivity capable of sufficiently effecting printing and having an excellent printing endurance as a printing plate has not yet been developed. Moreover, it has earnestly been desired to develop a lithographic printing plate having a practically usable sensitivity and is capable of handing under a light room.

SUMMARY OF THE INVENTION

Accordingly, an object of the present invention is to provide a method of making a lithographic printing plate using a lithographic printing plate material utilizing the silver complex diffusion transfer process which is capable of handing under light room conditions, i.e., under bright safe light (yellow fluorescent light) and a scanning type exposure device on which a violet laser diode is mounted. Another object of the present invention is to provide a lithographic printing plate material for a violet laser scanning exposure excellent in printing endurance.

The above-mentioned objects of the present invention has been accomplished basically by a process for making a lithographic printing plate.

(1) A process for making a lithographic printing plate, which comprises subjecting a lithographic printing material having at least a silver halide emulsion layer and a physical development nuclei layer on a support and having a sensitivity at a wavelength of 400 nm to 440 nm of 20 $\mu J/cm^2$ or less, and having substantially no sensitivity at a wavelength of 450 nm or longer to scanning exposure by a scanning type exposure device on which a violet laser diode is mounted, and then subjecting to developing treatment.

(2) A process for making a lithographic printing plate, which comprises subjecting a lithographic printing material having at least a silver halide emulsion layer containing at least one of sensitizing dyes represented by the following formulae (I), (II) and (III):

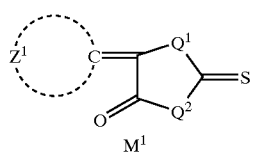

(I)

wherein $Z^1$ represents a group of atoms necessary for forming a 5- or 6-membered nitrogen-containing heterocyclic ring, Q1 represents O, S, $NR^{11}$ or $CO-NR^{12}$, and $Q^2$ represents O, S or $NR^{13}$, where $R^{11}$, $R^{12}$ and $R^{13}$ may be the same or different from each other and each represents a hydrogen atom, an alkyl group, or an aryl group, and M1 represents a counter ion for neutralizing an electric charge of the molecule,

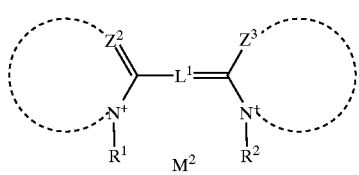

(II)

wherein $Z^2$ and $Z^3$ each represents a group of atoms necessary for forming a 5- or 6-membered nitrogen-containing heterocyclic ring, provided that both of $Z^2$ and $Z^3$ do not contain a sulfur atom simultaneously, $R^1$ and $R^2$ may be the same or different from each other and each represents an alkyl group, $L^1$ represents a methyne group, and $M^2$ represents a counter ion for neutralizing an electric charge of the molecule,

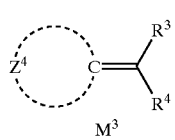

(III)

wherein $Z^4$ represents a group of atoms necessary for forming a 5- or 6-membered nitrogen-containing heterocyclic ring, $R^3$ and $R^4$ may be the same or different from each other and each represents an alkyl group, an alkoxycarbonyl group, an aryloxycarbonyl group, an alkylsulfonyl group, an arylsulfonyl group, an acyl group or a cyano group, and $M^3$ represents a counter ion for neutralizing an electric charge of the molecule, and a physical development nuclei layer on a support to scanning exposure by a scanning type exposure device on which a violet laser diode is mounted, and then subjecting to developing treatment.

DESCRIPTION OF THE PREFERRED EMBODIMENTS

The present invention will be explained in more detail below.

A scanning type exposure device on which a violet laser diode is mounted has merits that convergence of a laser is good due to an extremely shorter wavelength than the conventional laser whereby image qualities of fine line or dot are excellent. Moreover, oscillation wavelength of the laser is a shorter wavelength of 400 to 430 nm or so, so that it is possible to handle a lithographic printing plate material under a yellow fluorescent light in which light with a shorter wavelength than about 450 nm is substantially removed. However, the scanning type exposure device on which a violet laser diode is mounted has a smaller laser power as compared with the conventional laser exposure device. Accordingly, a lithographic printing plate material which has high sensitivity to light of 400 to 440 nm, preferably 400 to 430 nm and has no sensitivity under the above-mentioned yellow fluorescent light has been desired.

By using the lithographic printing plate material of the present invention as mentioned above and a scanning type exposure device on which a violet laser diode is mounted are used in combination, a lithographic printing plate which can be handled under bright fluorescent light and is excellent in printing properties can be obtained.

In the present invention, sensitivity of the lithographic printing plate material is represented by an exposure energy. The sensitivity of the lithographic printing plate material can be obtained by the method as mentioned below.

First, by using a high intensity xenon sensitometer, an exposure energy at an exposure time of $10^{-5}$ second is measured under the conditions of interposing an interference filter of 410 nm. For the measurement of the exposure energy, for example, RADIOMETER (for example, available from International Light Co., RESEARCH RADIO-ETER IL1700) can be used. Next, under the same conditions as mentioned above, the lithographic printing plate material was exposed through a wedge in which a transmittance density changes each 0.15 stepwisely and developed. Thus, an image corresponding to the above-mentioned wedge is formed on the lithographic printing plate. Next, a reflection density of the image formed on the lithographic printing plate is measured by using a densitometer (for example, Macbeth TR-927, trade name, manufactured by Macbeth Co.) and an exposure energy at which the reflection density is 1.0 is measured from an energy of the above-mentioned high intensity xenon sensitometer and the number of wedge steps. The exposure energy thus obtained is shown as sensitivity of the lithographic printing plate material with a unit of $\mu J/cm^2$.

The lithographic printing plate material of the present invention has sensitivity as mentioned above of 20 $\mu J/cm^2$ or less, preferably 15 $\mu J/cm^2$ or less, more preferably 10 $\mu j/cm^2$ or less.

The lithographic printing plate material of the present invention has at least one silver halide emulsion layer and at least one physical development nuclei layer on a support.

The silver halide emulsion to be used in the silver halide emulsion layer preferably comprises 70 mol % or more of silver chloride. More preferably those containing 80 mol % or more of silver chloride, further preferably 20 mol % or less is silver bromide If the ratio of the silver bromide is increased, safe light safety under the yellow fluorescent light becomes worse, photographic characteristics becomes soften and printing properties are deteriorated so that it is not preferred.

It is preferred that a water-soluble iridium compound is added to the silver halide emulsion. As the water-soluble iridium compound, various kinds of materials may be used and there may be representatively mentioned iridium chloride (IrCl₃ and IrCl₄), hexahalogenoiridic acid (III) or a salt thereof, hexahalogenoiridic acid (IV) or a salt thereof, etc. An amount of the iridium compound is preferably about $10^{-8}$ to $10^{-4}$ mol per mol of the silver halide, more preferably $10^{-7}$ to $10^{-5}$ mol per mol of the same.

Also, to the silver halide emulsion of the present invention, a rhodium salt may be added. As the rhodium salt, those conventionally known in the art can be used and there may be representatively mentioned rhodium monochloride, rhodium dichloride, rhodium trichloride, rhodium ammonium chloride, etc. An amount of the rhodium salt is preferably about $10^{-8}$ to $10^{-3}$ mol per mol of the silver halide, more preferably $10^{-7}$ to $10^{-4}$ mol per mol of the same.

Crystal shape of the silver halide according to the present invention is not particularly limited, and it may be cubic or tetradeca hedral grain, or either a core-shell type or a flat plate particle. The silver halide crystal may be monodispersed or polydispersed, and a monodispersed emulsion is preferably used. The term "monodispersed" herein mentioned means that 90% or more of the total particles is within the range of ±40% of an average grain size, more preferably that having a particle size within ±20%.

A preferred range of the particle size of the silver halide to be used in the present invention is 0.1 μm to 0.5 μm, more preferably 0.15 μm to 0.4 μm, particularly preferably 0.2 μm to 0.4 μm.

As the silver halide emulsion to be used in the present invention, those to which chemical sensitization is applied are preferred. As the chemical sensitization, there may be mentioned a metal sensitization using a gold compound or a silver compound, a sulfur sensitization using a sulfur compound, or a combination thereof. Preferred is a gold-sulfur sensitization using a gold compound and a sulfur compound in combination.

In the present invention, a sensitivity of 20 μJ/cm² or less to light having a wavelength of 400 to 440 nm can be obtained by optionally combining the composition of the silver halide, adjustment of the grain size of the silver halide, addition of the iridium compound and chemical sensitization.

In the present invention, a lithographic printing plate material having substantially no sensitivity at 450 nm or longer means that there is no difference in printing properties between a lithographic printing plate material subjected to no irradiation and a lithographic printing plate material in which a yellow fluorescent light (pure yellow fluorescent light FL-40SYF/M available from NEC Co., Japan) from which a short wavelength of about 450 nm is substantially removed is irradiated as a safe light so that light with 180 lux is exposed to the material for 5 minutes.

As a means to obtain a lithographic printing plate having substantially no sensitivity at 450 nm or longer, it can be realized by adjustment of the grain size of the silver halide, adjustment of the composition of the silver halide, addition of the rhodium salt, addition of antifogging agent such as a mercapto compound, addition of an organic desensitizing agent, or addition of a non-sensitizing dye or pigment which mainly absorbs light at a wavelength of 450 nm to 600 nm, or an optional combination of the above two or more.

The above-mentioned organic desensitizing agent is characterized by a polarograph half wave potential, i.e., by an oxidation-reduction potential determined by a polarography. As the organic desensitizing agent which is effective for the present invention, those having the sum of the polarograph anode potential and the polarograph cathode potential is positive may be mentioned. With regard to measurement of these oxidation-reduction potential, it is described in, for example, U.S. Pat. No. 3,501,307. Specific examples of such an organic desensitizing agent are described in many patent specifications and literatures, and either of them can be used in the present invention. For example, the compounds as disclosed in Japanese Patent Publications No. 17595/1961, No. 26751/1965, No 13167/1968, No. 8833/1970, No. 8746/1972, No 10197/1972 and No. 37530/1075, Japanese Provisional Patent Publications No. 24734/1973, No. 84639/1974 and No. 142525/1981, and U.S. Pat. Nos. 2,271,229, 2,541,472, 3,035,917, 3,062,651, 3,124,458, 3,326,687 and 3,671,254, etc.

An amount of the organic desensitizing agent to be used in the present invention is preferably 0.01 mg to 5 g, more preferably 0.01 mg to 1 g per mol of the silver halide.

The unsensitive dye or pigment to be used in the present invention is a dye or pigment which is capable of absorbing light mainly at a wavelength of 450 nm to 600 nm. It is preferably a material having a maximum absorption at such a wavelength region in a layer. However, the numerical value of 450 nm, particularly 600 nm is not a strict value and those having a sufficient absorption to light with a wavelength of 450nm to 600 nm can be used. The above-mentioned dye or pigment can be added to the silver halide emulsion layer or a protective layer. The protective layer is provided to a lithographic printing plate material using a support made of aluminum (aluminum lithographic printing plate) as mentioned below in some cases.

The unsensitive dyes or pigments to be used in the present invention are described, for example, U.S. Pat. Nos. 2,274,782, 2,527,583, 2,533,472, 2,464,785, 2,611,112, 2,598,660, 3,005,711, 2,494,032, 2,956,879, 2,383,699, 3,615,608 and 3,840,375, British Patents No. 1,253,933 and No. 1,338,799, West Germany Provisional Patent Publications No. 20 26 252, No. 21 27 327, No. 23 21 470 and No. 23 47 590, Japanese Provisional Patent Publications No 17322/1973, No. 85130/1973, No. 114420/1974, No. 23221/1975, No. 28827/1975, No. 115815/1975, No. 10927/1976, No. 77327/1976, No. 29727/1977, No 65426/1977, No. 108115/1977, No. 111717/1977, No. 128125/1977, No. 29804/1980, No. 33103/1980, No. 33104/1980, No. 46752/1980, No. 88047/1980, No. 155350/1980, No. 161232/1980, No. 161234/1980, No. 120660/1980 and No. 64039/1988, and Japanese Patent Publication No 12242/1971, etc. Of these, any materials may be used irrespective of kinds thereof so long as it can absorb light with a wavelength of 450 nm to 600 nm. There may be mentioned, for example, an oxonol type, azo type, xanthene type, cyanine type, triphenylmethane type, styryl type, merocyanine type, anthraquinone type, and indophenol type compound, etc.

An amount of the unsensitive dye or pigment to be used in the present invention is desirably in the range of about 5 mg to about 1 g per m² of the lithographic printing plate material, and an optical density (reflection or transmittance) at the maximum absorption wavelength is preferably 0.3 or higher.

In the present invention, to heighten sensitivity to a violet laser diode, a sensitizing dye may be added to the silver halide emulsion layer. As the sensitizing dye, the sensitizing dye selected from the following formulae is preferably used. The sensitizing dyes of the following formulae do not substantially have sensitizing property to light of 450 nm or longer so that there is no hindrance to handle the material under light room (under yellow fluorescent light).

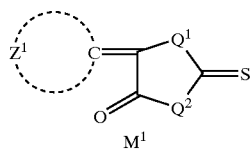

(I)

wherein $Z^1$ represents a group of atoms necessary for forming a 5- or 6-membered nitrogen-containing heterocyclic ring, Q1 represents O, S, $NR^{11}$ or $C\text{—}NR^{12}$, and $Q^2$ represents O, S or $NR^{13}$, where $R^{11}$, $R^{12}$ and $R^{13}$ may be the same or different from each other and each represents a hydrogen atom, an alkyl group, or an aryl group, and M1 represents a counter ion for neutralizing an electric charge of the molecule, wherein $Z^2$ and $Z^3$ each represents a group of atoms

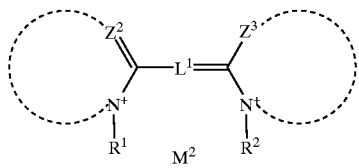

(II)

necessary for forming a 5- or 6-membered nitrogen-containing heterocyclic ring, provided that both of $Z^2$ and $Z^3$ do not contain a sulfur atom simultaneously, $R^1$ and $R^2$ may be the same or different from each other and each represents an alkyl group, $L^1$ represents a methyne group, and $M^2$ represents a counter ion for neutralizing an electric charge of the molecule,

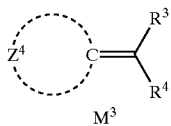

(III)

wherein $Z^4$ represents a group of atoms necessary for forming a 5- or 6-membered nitrogen-containing heterocyclic ring, $R^3$ and R4 may be the same or different from each other and each represents an alkyl group, an alkoxycarbonyl group, an aryloxycarbonyl group, an alkylsulfonyl group, an arylsulfonyl group, an acyl group or a cyano group, and $M^3$ represents a counter ion for neutralizing an electric charge of the molecule.

The sensitizing dye represented by the above-mentioned formulae (I), (II) and (III) are explained in detail below.

As an example of the heterocyclic ring of $Z^1$ in the formula (I), there may be mentioned, for example, an oxazole ring, benzoxazole ring, benzoisoxazole ring, naphthoxazole ring, pyridoxazole ring, thiazole ring, benzothiazole ring, naphthothiazole ring, selenazole ring, benzoselenazole ring, pyridine ring, quinoline ring, etc., and these heterocyclic ring, fused benzene ring or naphthalene ring may have a substituent. Examples of the substituent may include, for example, an alkyl group such as methyl and ethyl groups, an alkoxy group such as methoxy and ethoxy groups, a methylenedioxy group, an aryl group such as phenyl and methoxyphenyl groups, a hydroxy group, a carboxy group, an alkoxycarbonyl group such as methoxycarbonyl and ethoxycarbonyl groups, a halogen atom such as fluorine, chlorine, bromine and iodine, etc.

Moreover, as the substituent of the nitrogen atom at the heterocyclic ring represented by $Z^1$, there may be mentioned, for example, methyl, ethyl, n-propyl, i-propyl, n-butyl, n-amyl, β-hydroxyethyl, γ-hydroxypropyl, β-acetoxyethyl, γ-acetoxypropyl, β-methoxyethyl, γ-methoxypropyl, carbamoyl-methyl, carbamoylethyl, N-methylcarbamoylmethyl, N-ethyl-carbamoylmethyl, N-methylcarbamoylethyl, N,N-dimethyl-carbamoylmethyl, N,N-dimethylcarbamoylethyl, N,N-diethyl-carbamoylmethyl, carboxymethyl, β-carboxyethyl, γ-carboxy-propyl, δ-carboxybutyl, ω-carboxypentyl, methoxycarbonyl-methyl, ethoxycarbonylmethyl, β-methoxycaronylethyl, γ-methoxycarbonylpropyl, δ-methoxycarbonylbutyl, ethoxy-carbonylethanesulfonylethyl, carbamoylethanesulfonylethyl, caroxyethnesulfonylethyl, β-sulfoethyl, γsulfopropyl, γ-sulfobutyl, δ-sulfobutyl, benzyl, phenethyl, p-carboxybenzyl, p-sulfophenethyl, allyl, propargyl, trifluoroethyl groups, etc.

Examples of the alkyl groups of $R^{11}$, $R^{12}$ and $R^{13}$ represented by $NR^{11}$, $CO\text{—}NR^2$ and $NR^{13}$ of $Q^1$ and $Q^2$ may include, for example, methyl, ethyl, propyl groups, etc., and examples of the aryl group thereof may include, for example, phenyl, tolyl, methoxyphenyl, chlorophenyl groups, etc.

Examples of a counter ion represented by M1 may include, for example, methylsulfuric acid, ethylsulfuric acid, thiocyanic acid, toluenesulfonic acid, chlorine, bromine, iodine, perchloric acid, potassium, sodium, triethylammonium, pyridinium, etc.

As the heterocyclic ring of $Z^2$ and $Z^3$ in the formula (II), they are the same as the definition for $Z^1$ in the formula (I). However, the case where $Z^2$ and $Z^3$ simultaneously include S atom is excluded. As the alkyl group represented by $R^1$ and $R^2$, there may be mentioned, for example, methyl, ethyl, n-propyl, i-propyl, n-butyl, n-amyl, β-hydroxyethyl, γ-hydroxypropyl, β-acetoxyethyl, γ-acetoxypropyl, β-methoxyethyl, γ-methoxypropyl, carbamoylmethyl, carbamoylethyl, N-methylcarbamoylmethyl, N-ethylcarbamoylmethyl, N-methylcarbamoylethyl, N,N-dimethylcarbamoylmethyl, N,N-dimethylcarbamoylethyl, N,N-diethylcarbamoylmethyl, carboxymethyl, β-carboxyethyl, γ-carboxypropyl, δ-carboxybutyl, ω-carboxypentyl, methoxy-carbonylmethyl, ethoxycarbonylmethyl, β-methoxycaronylethyl, γ-methoxycarbonylpropyl, δ-methoxycarbonylbutyl, ethoxy-carbonylethanesulfonylethyl, carbamoylethanesulfonylethyl, caroxyethnesulfonylethyl, β-sulfoethyl, γ-sulfopropyl, γ-sulfobutyl, δ-sulfobutyl, benzyl, phenethyl, p-carboxybenzyl, p-sulfophenethyl, allyl, propargyl, trifluoroethyl groups, etc.

The methyne group of $L^1$ may have a substituent (s), and examples of the substituent(s) may include those of the substituents mentioned in the above mentioned $R^1$ or a heterocyclic ring such as furyl, thienyl, tetrahydropyranyl, etc. The counter ion represented by $M^2$ has the same meaning as that of $M^1$.

The hetero ring represented by $R^4$ in the formula (III) has the same meaning as that of the above-mentioned $Z^1$. As the alkyl group represented by $R^3$ and $R^4$, there may be mentioned a methyl group, an ethyl group, a propyl group, a butyl group, etc. As the alkoxy group of the alkoxycarbonyl group, there may be mentioned a methoxy group, an ethoxy group, a propoxy group, etc. As the aryl group of the aryloxycarbonyl group, there may be mentioned a phenyl group, etc. As the alkyl group of the alkylsulfonyl group, there may be mentioned a methyl group, an ethyl group, a propyl group, a butyl group, etc. As the aryl group of the arylsulfonyl group, there may be mentioned a phenyl group, etc. Also, as the acyl group, there may be mentioned an acetyl group, a propionyl group, a butyryl group, an isobutyryl group, a benzoyl group, etc. The counter ion represented by $M^3$ has the same meaning as that of $M^1$.

In the following, specific examples of the sensitizing dyes represented by the above-mentioned formulae (I), (II) and (III) are shown.

S-1
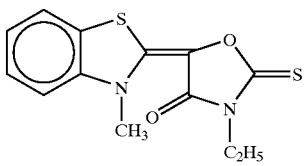

S-2
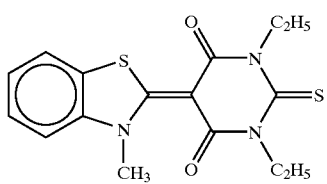

S-3
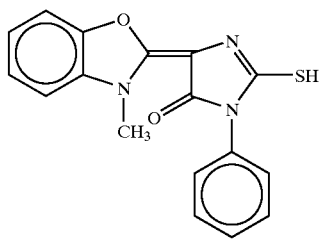

S-4
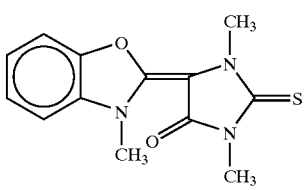

S-5
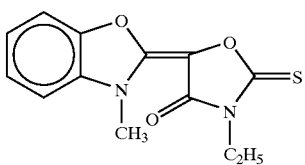

S-6
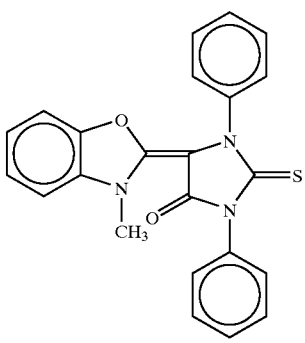

S-7
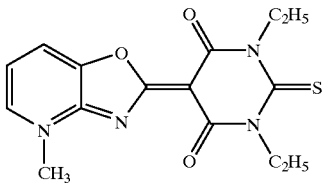

S-8
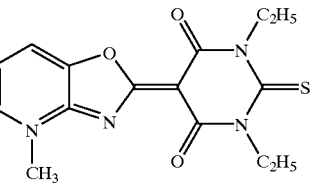

S-9
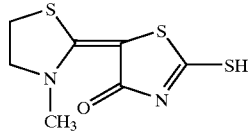

S-10
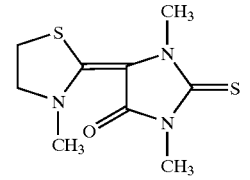

S-11
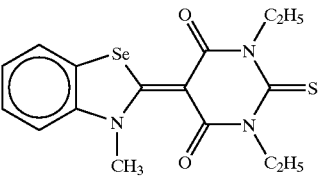

S-12
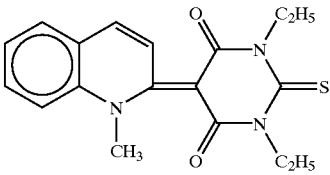

S-13
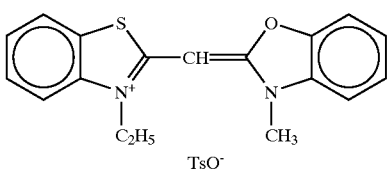

S-14
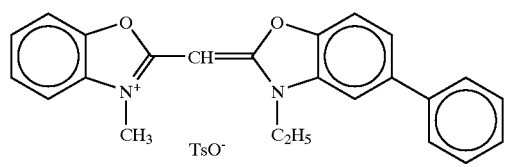

S-15
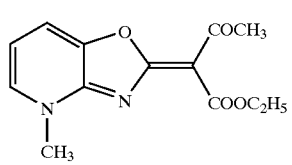

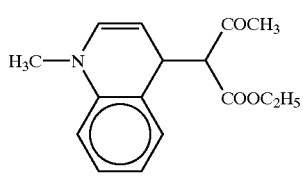

S-16

Among the sensitizing dyes as mentioned above, those represented by the formulae (I) and (II) ate preferred, more preferably those represented by the formula (I). Among the compounds represented by the formula (I), a sensitizing dye in which the heterocyclic ring represented by $Z^1$ is benzoxazole is particularly preferred.

The above-mentioned sensitizing dye is contained in the silver halide emulsion layer, and an amount to be added is preferably within the range of $10^{-5}$ to $10^{-2}$ mole per mole of silver halide.

As the lithographic printing plate material utilizing the silver complex diffusion transfer process, there are two types of the materials as mentioned above.

One of the types is a lithographic printing plate material (a flexible lithographic printing plate material) in which an undercoat layer having a function of a halation preventive layer, and a silver halide emulsion layer and a physical development nuclei layer are provided in this order on a paper support coated by a polyethylene resin or a polyester film support such as polyethylene terephthalate film, etc.

Another type is a lithographic printing plate material (an aluminum lithographic printing plate material) in which a physical development nuclei layer is provided on a roughened and anodized aluminum support, and a silver halide emulsion layer is provided thereon. To this lithographic printing plate material, an intermediate layer can be optionally provided between the physical development nuclei layer and the silver halide emulsion layer, and a protective layer may be provided on the silver halide emulsion layer.

As the physical development nuclei to be contained in the physical development nuclei layer, there may be mentioned a metal colloidal fine particle of a metal such as silver, antimony, bismuth, cadmium, cobalt, lead, nickel, palladium, rhodium, gold, platinum, etc., or a sulfide, a polysulfide, or a selenide of these metals, a mixture thereof or a mixed crystal thereof, and they are not particularly limited so long as it catalyzes a reduction of physical development of a silver complex ion.

To the physical development nuclei layer, a water-soluble polymer may be added. The water-soluble polymer is a water-soluble polymer having a functional group which has affinity with silver and having a functional group which gives hydrophilic activity. Examples of the functional group having affinity with silver may include a thioether group, a thiol group, a thioxo group, an amino group, an ether group, a hydroxy group, a guanidino group, an amidino group, an isoureido group, an isothioureido group, an amidinoisothioureido group, a fused ring of a benzene ring or a naphthalene ring, a 5- or 6-membered heterocyclic ring group containing at least one of N, O and S. Examples of the functional group which gives a hydrophilic activity may include a hydroxyl group, a carboxyl group, a sulfo group, an amide group, etc. Specific examples of the water-soluble polymer containing these functional groups are described in many patent specifications and literatures such as Japanese Provisional Patent Publications No. 21602/1988, No. 67437/1994, No 332183/1994, No. 253671/1995 and No. 211614/1996 (which corresponds to U.S. Pat. No. 5,698,367), etc.

In the physical development nuclei layer, a developing agent such as hydroquinone, methyl hydroquinone, catechol, etc., or a conventionally known hardening agent such as formalin, dichloro-s-triazine, etc., may be contained.

In the silver halide emulsion layer, the undercoat layer, the intermediate layer and the protective layer, a binder is generally used. As the binder, gelatin is preferably used, but other hydrophilic binder such as starch, dextrin, albumin, sodium alginate, hydroxyethyl cellulose, Gum Arabic, polyvinyl alcohol, polyvinyl pyrrolidone, carboxymethyl cellulose, polyacrylamide, styrene-maleic anhydride copolymer, polyvinyl methyl ether-maleic anhydride copolymer, etc., may be substituted for a part of gelatin. Moreover, a polymer latex may be used.

The former lithographic printing plate which uses a gelatin-containing layer as a non-image portion is required to form a firm gelatin film by adding a gelatin cross-linking agent (a hardening agent) to the silver halide emulsion layer and the undercoat layer. On the other hand, in the latter lithographic printing plate, the silver halide emulsion layer, etc., is/are removed to expose the surface of aluminum so that a non-image portion is formed. Thus, the gelatin to be used in the silver halide emulsion layer is desirably a material which does not substantially contain a hardening agent.

As the hardening agent to cross-linking the gelatin, there may be mentioned, for example, an inorganic compound such as chromium alum, an aldehyde such as formalin, glyoxal, malealdehyde, glutaraldehyde, etc., an N-methylol compound such as urea or ethylene urea, etc., an aldehyde such as mucochloric acid, 2,3-dihydroxy-1,4-dioxane, etc., a compound having an active halogen such as 2,4-dichloro-6-hydroxy-s-triazine salt, 2,4-dihydroxy-6-chloro-s-triazine salt, etc., divinylsulfone, divinyl ketone, N,N,N-triacryloylhexa-hydrotriazine, an active tricyclic compound having two or more ethyleneimino groups or epoxy groups in the molecule, and dialdehyde starch, etc. as a polymer hardening agent, and these compounds may be used singly or in combination of two or more.

A thickness of an anodized layer of the roughened and anodized aluminum plate to be used in the aluminum lithographic printing plate material is preferably within the range of about 0.3 to 3.0 $\mu$m. Incidentally, before effecting the anodizing treatment, a desmutting treatment is preferably applied to. That is, a roughened aluminum substrate is treated by a 10 to 50% hot sulfuric acid (40 to 60° C.) or a diluted alkali (sodium hydroxide, etc.) whereby smut attached on the surface can be removed.

After subjecting to anodizing treatment, a post treatment can be carried out, if necessary. For example, a method of dipping the aluminum plate in an aqueous polyvinylsulfonic acid solution as disclosed in British Patent No. 1,230,447. Also, if necessary, it is possible to provide an undercoat layer of a hydrophilic polymer, and it is optionally selected depending on the characteristics of the light-sensitive layer provided thereon.

The method of making the lithographic printing plate of the present invention comprises subjecting the above-mentioned lithographic printing plate to scanning exposure by a scanning type exposure device on which a violet laser diode is mounted, and then, subjecting to developing treatment.

To the developing solution to be used in the present invention, an alkaline substance such as sodium hydroxide, potassium hydroxide, lithium hydroxide and sodium triphosphoate, a preservative such as a sulfite, a silver halide solvent such as a thiosulfate, a thiocyanate, a cyclic imide, 2-mercaptobenzoic acid, an amine, etc., a thickening agent such as hydroxyethyl cellulose, carboxymethyl cellulose, etc., an antifoggant such as potassium bromide, a compound as disclosed in Japanese Provisional Patent Publication No. 26201/1972, etc., a developing agent such as hydroquinone, catechol, 1-phenyl-3-pyrazolidone, et., a developing modifier such as a polyoxyalkylene compound, an onium compound, etc. may be added. Moreover, in the developing solution, a compound which improve flow of ink of a silver image as disclosed in U.S. Pat. No. 3,776,728, etc., may be used. A pH of the developing solution is suitably about 10 to about 14, more preferably a pH 12 to 14 or so.

Also, a developing agent necessary for development is added to the lithographic printing plate and a developing solution substantially containing no developing agent, i.e., an alkali activated treating solution may be used. This treating solution is particularly suitable for a flexible lithographic printing plate material (a lithographic printing plate using paper or a polyester film as a support).

The silver image portion after development of the lithographic printing plate of the present invention can be converted into an ink-receptive by an optional conventionally known surface treating agent or an receptive property can be strengthened. Such a treating agent is described in, for example, Japanese Provisional Patent Publication No. 29723/1973, U.S. Pat. No. 3,721,559, etc. As a printing method, or a desensitizing agent, a dampening solution, etc. to be used, those conventionally known in the art can be used.

EXAMPLE

In the following, the present invention will be explained by referring to Examples, but the present invention is not limited by these.

Example 1

A support in which the both surfaces of a base paper with 135 g/m$^2$ had been covered by a polyethylene resin was used. On one surface of said support, a gelatin layer (a baking layer) containing silica fine particles having an average grain size of 5.0 μm was provided. An opposite surface of the support was subjected to corona discharge treatment, and then, an undercoat layer and a silver halide emulsion layer were simultaneously subjected to multi-layer coating and dried.

The undercoat layer contains 0.3 g/m$^2$ of carbon black, 0.3 g/m$^2$ of silica fine particles (SY435, trade name, available from Fuji sylysia Chemical K.K., Japan) having an average grain size of 4.0 μm, 3.5 g/m$^2$ of gelatin, and 170 mg/m$^2$ of 2,4-di-chloro-6-hydroxy-s-triazine sodium as a film hardening agent.

As a silver halide emulsion used in the silver halide emulsion layer, five kinds of emulsions are prepared by changing an iridium salt (IrCl$_4$), particle size of the silver halide, and chemical sensitization (gold-sulfur sensitization) as shown in Table 1. These five kinds of silver halide emulsions each contain 10 mol % of silver chloride.

To the silver halide emulsion layer were added 0.1 g/m$^2$ of 1-phenyl-3-pyrazolidone, 80 mg/m$^2$ of N-methylolethylene urea as a film hardening agent and an additive shown in Table 2. The thus prepared silver halide emulsion layer is so coated that a silver nitrate amount is 1.0 g/m$^2$, and a gelatin amount is 0.8 g/m$^2$.

After coating the undercoat layer and the silver halide emulsion layer, a physical development nuclei layer is coated and dried to prepare nine kinds of lithographic printing plates shown in Table 2. The physical development nuclei layer is a layer in which 4 mg/m$^2$ of pullurane of Japanese Provisional Patent Publication No. 277747/1992 was further added to the physical development nuclei layer (containing a copolymer of acrylamide and imidazole is contained as a polymer, and 0.5 g/m$^2$ of hydroquinone is contained as a developing agent) described in Example 2 of Japanese Provisional Patent Publication No. 21602/1978.

TABLE 1

| Silver halide emulsion | Amount of iridium salt (mol/l mol of silver halide) | Particle size of silver halide (μm) | Chemical sensitiztion |
|---|---|---|---|
| Em-1 | None | 0.3 | None |
| Em-2 | None | 0.06 | None |
| Em-3 | $10^{-6}$ | 0.07 | Done |
| Em-4 | $10^{-8}$ | 0.39 | Done |
| Em-5 | $10^{-6}$ | 0.31 | Done |

TABLE 2

| | | Additive | | | |
|---|---|---|---|---|---|
| Printing plate | Silver halide emulsion | Formula (i) (g/m$^2$) | Formula (ii) (mg/g of silver nitrate) | Formula (iii) (g/m$^2$) | Formula (iv) (g/m$^2$) |
| 1 | Em-1 | None | None | None | None |
| 2 | Em-2 | None | None | None | None |
| 3 | Em-3 | None | None | None | None |
| 4 | Em-4 | None | None | None | None |
| 5 | Em-5 | None | None | None | None |
| 6 | Em-4 | 0.2 | None | None | None |
| 7 | Em-5 | 0.2 | None | None | None |
| 8 | Em-5 | 0.2 | 4.0 | 50 | None |
| 9 | Em-5 | None | 4.0 | 50 | 60 |

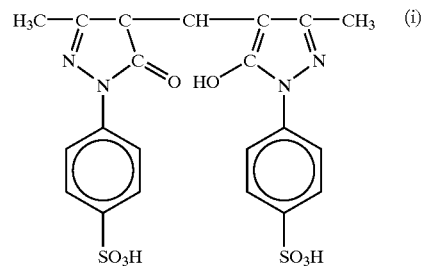

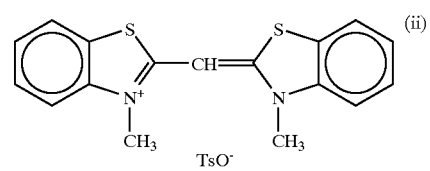

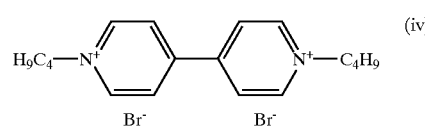

With regard to nine kinds of the lithographic printing plate materials thus prepared, sensitivity was each measured by the method as mentioned above. As a developing solution, that having the following composition was used. Incidentally, with regard to the material the sensitivity of which cannot be obtained by the above-mentioned method due to too low sensitivity, it was measured by changing the exposure time to $10^{-4}$ second.

Also, with regard to handling property under bright room conditions, a sample to which safe light (yellow fluorescent light) was irradiated for 5 minutes by the method as mentioned above and a sample not irradiated were prepared, and these samples were subjected to scanning exposure by using a scanning type exposure device on which a violet laser diode had been mounted (manufactured by ESCHER GRAD Co., Plate Setter Cobalt 8CTP, trade name), and developing treatment was carried out by using a developing solution having the following composition at 30° C. for 30 seconds.

| <Developing Solution> | |
|---|---|
| Water | 700 g |
| Sodium hydroxide | 18 g |
| Potassium hydroxide | 7 g |
| Anhydrous sodium sulfite | 50 g |
| 2-Mercaptobenzoic acid | 1 g |
| Uracil | 10 g |
| 2-Methylaminoethanol | 30 g |
| 5-Phenyl-2-mercapto-1,3,4-oxadiazole | 0.1 g |
| Potassium bromide | 1 g |

Made up the total amount to 1,000 ml by addition of water.

After the developing treatment, excess developing solution on the surface of the plate was removed, and the plate was immediately treated by a stabilizing solution having the following composition at 25° C. for 20 seconds, and then, excess stabilizing solution was removed by squeeze rollers and the plate was dried at room temperature.

| <Stabilizing solution> | |
|---|---|
| Water | 600 g |
| Citric acid | 10 g |
| Sodium citrate | 35 g |
| Colloidal silica (20%) | 5 g |
| Ethylene glycol | 5 g |

Made up the total amount to 1,000 ml by addition of water.

The lithographic printing plates thus made according to the above-mentioned procedures were each mounted on an offset printing machine (Rhobi 2800CD, trade name, available from Rhobi K.K., Japan), and the following etch solution was provided onto the whole surface of the plate and printing was carried out. Oil-base off set ink 3-1012 available from A, B, Dick Co. was used as ink, and a dampening solution having the following composition was used. The printing conditions were at room temperature of 21° C. and a humidity of 70% RH (relative humidity).

| <Etch solution> | |
|---|---|
| Water | 600 ml |
| Isopropyl alcohol | 400 ml |
| Ethylene glycol | 50 g |
| 3-Mercapto-4-acetamido-5-n-heptyl-1,2,4-triazole | 1 g |

| <Dampening solution> | |
|---|---|
| o-Phosphoric acid | 10 g |
| Nickel nitrate | 5 g |
| Sodium sulfite | 5 g |
| Ethylene glycol | 100 g |
| Colloidal silica (20% liquid) | 28 g |

| <Dampening solution> | |
|---|---|
| o-Phosphoric acid | 10 g |
| Nickel nitrate | 5 g |
| Sodium sulfite | 5 g |
| Ethylene glycol | 100 g |
| Colloidal silica (20% liquid) | 28 g |

Made up to 2 liters by addition of water.

Evaluation of the printing endurance was carried out by measuring a number of printed sheets at which lack of an image due to defect of a silver image portion of the printing plate occurred so that printing could not be carried out, and the respective printing plates were measured by the following evaluation standard. The evaluation results of sensitivity and printing endurance were shown in Table 3.

(A) 15,000 sheets or more
(B) 10,000 sheets or more and less than 15,000 sheets
(C) 5,000 sheets or more and less than 10,000 sheets
(D) 1,000 sheets or more and less than 5,000 sheets
(E) less than 1,000 sheets

TABLE 3

| | | Printing endurace | | |
|---|---|---|---|---|
| Printing plate | Sensitivity ($\mu J/cm^2$) | Before irradiation of yellow fluorescent light | After irradiation of yellow fluorescent light | Remarks |
| 1 | 36.0 | Impossible to print | Impossible to print | Comparative |
| 2 | 52.5 | Impossible to print | Impossible to print | Comparative |
| 3 | 20.6 | Impossible to print | Impossible to print | Comparative |
| 4 | 2.5 | B | Impossible to print | Comparative |
| 5 | 3.0 | A | Impossible to print | Comparative |
| 6 | 8.5 | B | B | This invention |
| 7 | 7.3 | A | A | This invention |
| 8 | 2.7 | A | A | This invention |
| 9 | 1.8 | A | A | This invention |

In the table, impossible to printing means that a silver image cannot be formed due to low practical sensitivity or a silver image cannot be formed since fogging is formed by irradiation of yellow fluorescent light.

From the above-mentioned results, the lithographic printing plates of the present invention are possible to handle in a light room (under yellow fluorescent light) and have a sufficient practically usable sensitivity to a scanning type exposure device on which a violet laser diode is mounted, and it can be understood that they have excellent printing endurances.

Example 2

A support to which a subbing layer has previously been provided with a thickness of 175 μm was used. On one surface (a back surface) of said support, a back coating first layer containing 2 g/m² of conductive carbon and 1.5 g/m² of gelatin, and a back coating second layer containing 0.1 g/m² of silica fine particles having an average grain size of 3.5 μm, 1 g/m² of gelatin, and 150 mg/m² of 2,4-dichloro-6-hydroxy-s-triazine sodium as a film hardening agent gelatin layer were provided by coating. An opposite surface of the support was subjected to corona discharge treatment, and then, an undercoat layer and a silver halide emulsion layer were simultaneously subjected to multi-layer coating.

The undercoat layer contains 3.5 g/m² of gelatin, 0.3 g/m² of carbon black, 1.2 g/m² of silica fine particles having an average grain size of 3.5 μm, 2 g/m² of styrene-butadiene latex (POL752A, trade name, available from Nippon A and L K.K., Japan), and 170 mg/m² of 2,4-dichloro-6-hydroxy-s-triazine sodium as a film hardening agent.

As a silver halide emulsion used in the silver halide emulsion layer, silver chloroiodide (silver chloride: 99 mol%) having an average grain size of 0.3 μm prepared by the double-et mixing method was used. At the time of preparing said silver halide, $5 \times 10^{-6}$ mol of rhodium chloride per mol of silver halide and $3 \times 10^{-6}$ mol of potassium hexachloroiridic acid (IV) per mol of silver halide were added to the silver halide, and after completion of ripening, desalting treatment was carried out and a chemical sensitization (gold-sulfur sensitization) was applied thereto. The silver halide emulsion layer further contains 0.1 g/m² of 1-pheny-3-pyrazolidone, $1.3 \times 10^{-3}$ mol of a sensitizing dye shown in Table 4, N-methylolethylene urea as a film hardening agent and a surfactant. Said silver halide emulsion layer was coated so that the silver nitrate amount is 1.5 g/m² and the gelatin amount of 0.8 g/m².

After coating the undercoat layer and the silver halide emulsion layer and drying, the material was heated at 40° C. for 5 days, and a physical development nuclei layer (as a polymer, P-2 was used) described in Example 1 of U.S. Pat. No. 5,698,367 was coated and dried to prepare six kinds of lithographic printing plate materials.

With regard to these lithographic printing plate materials, sensitivity and printing endurances before and after irradiating yellow fluorescent light were measured.

Provided that the printing endurance was evaluated by the following evaluation standard. The results are shown in Table 4.

◎: 20,000 sheets or more.

○: 10,000 sheets or more and less than 20,000 sheets.

Δ: 5,000 sheets or more and less than 10,000 sheets.

×: less than 5,000 sheets.

TABLE 4

| Printing plate | Sensitizing dye | Printing Endurance | | Remarks |
| | | Before irradiation of yellow fluorescent light | After irradiation of yellow fluorescent light | |
| --- | --- | --- | --- | --- |
| 10 | S-2 | ○ | ○ | This invention |
| 11 | S-4 | ◎ | ◎ | This invention |
| 12 | S-13 | ○ | ○ | This invention |
| 13 | S-14 | ○ | ○ | This invention |
| 14 | Formula (v) | Δ | Impossible to print | Comparative |
| 15 | Formula (vi) | Δ | Impossible to print | Comparative |

Sensitivities of the respective lithographic printing plate materials were each 3 μJ/cm² or less.

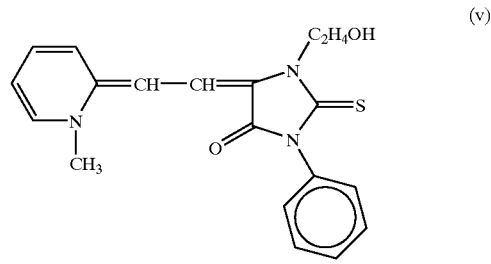

(v)

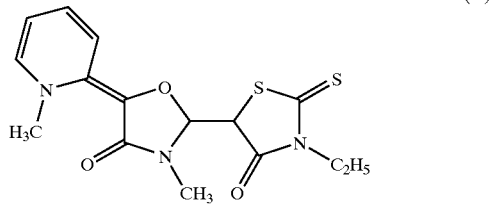

(vi)

Example 3

According to electrolytic surface-roughening treatment and anodization, an aluminum plate having a thickness of 0.30 mm which has about 5,600 pits having a diameter of 0.03 to 0.30 μm per 100 μm² on a plateau having an average diameter of about 5 μm and an average diameter of these pits being 0.08 μm was obtained. This aluminum plate was subjected to anodization after surface roughening treatment, and its average roughness (Ra) was 0.5 to 0.6 μm. On the support comprising the aluminum plate was coated a physical development nuclei layer and dried. The physical development nuclei layer was prepared by using a physical development nuclei liquid which had been prepared by a preparation method of a physical development nuclei liquid (A) described in Japanese Provisional Patent Publication No. 208843/1988 and adjusted a pH to 6.8.

On the above-mentioned aluminum pate on which the physical development nuclei layer has been formed was coated a silver halide emulsion layer and dried. As a silver halide used in the silver halide emulsion layer, five kinds of emulsions were prepared as shown in Table 5 by changing iridium salt (IrCl₄); grain size of the silver halide and chemical sensitization (gold-sulfur sensitization). These five kinds silver halide emulsions are each silver chlorobromide containing 85 mol % of silver chloride and 15 mol % of silver bromide.

To the silver halide emulsion layer was further added an additive as shown in Table 6. To the thus prepared silver halide emulsion layer was added so that a silver nitrate amount is 3.0 g/m² and the gelatin amount is 2.0g/m² whereby a lithographic printing plate material was prepared.

TABLE 5

| Silver halide emulsion | Amount of iridium salt (mol/mol of AgX) | Size of silver halide grain ($\mu$) | Chemical sensitization |
|---|---|---|---|
| Em-6 | None | 0.3 | None |
| Em-7 | None | 0.06 | None |
| Em-8 | $10^{-6}$ | 0.07 | Done |
| Em-9 | $10^{-8}$ | 0.39 | Done |
| Em-10 | $10^{-6}$ | 0.31 | Done |

TABLE 6

| | | | Additive | | |
|---|---|---|---|---|---|
| Printing plate | Silver halide emulsion | Formula (vii) (g/m²) | Formula (ii) (mg/g of silver nitrate) | Formula (iii) (g/m²) | Formula (viii) (g/m²) |
| 16 | Em-6 | None | None | None | None |
| 17 | Em-7 | None | None | None | None |
| 18 | Em-8 | None | None | None | None |
| 19 | Em-9 | None | None | None | None |
| 20 | Em-10 | None | None | None | None |
| 21 | Em-9 | 0.2 | None | None | None |
| 22 | Em-10 | 0.2 | None | None | None |
| 23 | Em-10 | 0.2 | 4.0 | 50 | None |
| 24 | Em-10 | None | 4.0 | 50 | 60 |

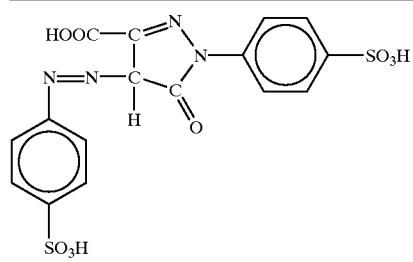

(vii)

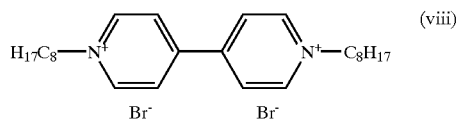

(viii)

With regard to the thus prepared nine kinds of lithographic printing plate materials, sensitivities were measured by the method as mentioned above. The developing solution used has the composition as mentioned below.

With regard to the handling property under the light room conditions, a sample in which a safe light ray (yellow fluorescent light) is irradiated by the method as mentioned above for 5 minutes, and a sample not irradiated are prepared. These samples were subjected to scanning exposure by using a scanning type exposure device on which a violet laser diode had been mounted (manufactured by ESCHER GRAD Co., Plate Setter: Cobalt 8CTP, trade name), and developing treatment was carried out by using the developing solution as mentioned below at 20° C. for 20 seconds, and then, the silver halide emulsion layer was immediately washed away by washing with a flowing water for 30 seconds, subsequently, a plate surface protecting liquid as disclosed in Japanese Provisional Patent Publication No. 265217/1993 was coated.

| <Developing solution> | |
|---|---|
| Hydroquinone | 20 g |
| Phenidone | 2 g |
| Sodium sulfite | 80 g |
| Ethylenediamine tetraacetic acid (EDTA) | 4 g |
| Sodium hydroxide | 22 g |
| N-methylethanolamine | 10 g |
| 2-Mercapto-5-n-heptyl-oxadiazole | 0.5 g |
| Polyethylene glycol (average molecular weight: 400) | 10 g |

Made up the total weight to 1000 cc by addition of water.
A pH was adjusted to 12.8.

The thus made lithographic printing plate was mounted on an offset printing machine (Heiderberg TOK, trade name, available from Heidelberg Co.) and a printing test was carried out. As ink, New Champion Black H (trade name) available from Dainippon Ink K.K. was used, and as a damping water, 0.5% by weight aqueous solution of Eu-3 (trade name, available from Fuji Photo Film, K.K.) was used. The printing conditions are at room temperature of 21° C. for 65% RH.

Evaluation of the printing endurance was carried out by measuring a number of printed sheets at which lack of an image due to defect of a silver image portion of the printing plate occurred so that printing could not be carried out, and the respective printing plates were measured by the following evaluation standard. The evaluation results of sensitivity and printing endurance were shown in Table 7.

(A) 15,000 sheets or more.

(B) 10,000 sheets or more and less than 15,000 sheets.

(C) 5,000 sheets or more and less than 10,000 sheets.

(D) 1,000 sheets or more and less than 5,0.00 sheets.

(E) less than 1,000 sheets.

TABLE 7

| | | Printing endurace | | |
|---|---|---|---|---|
| Printing plate | Sensitivity ($\mu J/cm^2$) | Before irradiation of yellow fluorescent light | After irradiation of yellow fluorescent light | Remarks |
| 16 | 36.0 | Impossible to print | Impossible to print | Comparative |
| 17 | 58.5 | Impossible to print | Impossible to print | Comparative |
| 18 | 21.6 | Impossible to print | Impossible to print | Comparative |
| 19 | 2.6 | B | Impossible to print | Comparative |
| 20 | 3.5 | A | Impossible to print | Comparative |
| 21 | 8.8 | B | B | This invention |
| 22 | 7.9 | A | A | This invention |

TABLE 7-continued

| Printing plate | Sensitivity ($\mu J/cm^2$) | Printing endurace Before irradiation of yellow fluorescent light | After irradiation of yellow fluorescent light | Remarks |
|---|---|---|---|---|
| 23 | 3.1 | A | A | This invention |
| 24 | 2.1 | A | A | This invention |

From the above-mentioned results, the lithographic printing plates using an aluminum support of the present invention are possible to handle in a light room (under yellow fluorescent light) and have a sufficient practically usable sensitivity to a scanning type exposure device on which a violet laser diode is mounted, and it can be understood that they have excellent printing endurances.

Example 4

As a support, the aluminum plate similar to that used in Example 3 was used. On the aluminum plate was coated a physical development nuclei liquid of palladium sulfide containing a small amount of a hydrophilic binder and dried. An amount of PdS nuclei contained in the physical development nuclei layer was 3 mg/m².

On the above-mentioned aluminum plate on which the physical development nuclei layer has been coated was coated a silver halide emulsion layer and dried. The silver halide emulsion used in the silver halide emulsion layer is a silver chloroiodobromide emulsion (containing 84.6 mol % of AgCl, 15 mol % of AgBr and 0.4 mol % of AgI) having an average particle size of 0.2 $\mu$m which was prepared by a control double jet method and to which $6\times10^{-6}$ mol of potassium hexachloroiridic acid (IV) was doped per mol of the silver halide. Moreover, this silver halide emulsion was chemically sensitized (gold-sulfur sensitization). To the silver halide emulsion layer were added $1\times10^{-3}$ mol of a sensitizing dye shown in Table 8 per mol of the silver halide, 0.3 g/m² of the filter dye represented by the above-mentioned formula (I) and a surfactant.

The thus prepared silver halide emulsion layer was so coated that a silver nitrate amount is 2.5 g/m² and a gelatin amount is 3.0 g/m² to prepare a lithographic printing plate material.

With regard to these lithographic printing plate materials, sensitivity and printing endurances before and after irradiating yellow fluorescent light were evaluated in the same manner as in Example 3. The results are shown in Table 8.

TABLE 8

| Printing plate | Sensitizing dye | Printing Endurance Before irradiation of yellow fluorescent light | After irradiation of yellow fluorescent light | Remarks |
|---|---|---|---|---|
| 25 | S-2 | B | B | This invention |
| 26 | S-4 | A | A | This invention |
| 27 | S-13 | B | B | This invention |
| 28 | S-14 | B | B | This invention |
| 29 | Formula (v) | C | Impossible to print | Comparative |
| 30 | Formula (vi) | C | Impossible to print | Comparative |

Sensitivities of the above-mentioned lithographic printing plates were each 3 $\mu J/cm^2$ or less.

What is claimed is:

1. A process for making a lithographic printing plate, which comprises subjecting a lithographic printing material having at least a silver halide emulsion layer and a physical development nuclei layer on a support and having a sensitivity at a wavelength of 400 nm to 440 nm of 20 $\mu J/cm^2$ or less, and having substantially no sensitivity at a wavelength of 450 nm or longer to scanning exposure by a scanning type exposure device on which a violet laser diode is mounted, and then subjecting to developing treatment, wherein the silver halide emulsion layer contains an organic desensitizing agent in which a sum of a positive electrode potential and a negative electrode potential of a polarograph is positive.

2. The process according to claim 1, wherein the lithographic printing plate is a lithographic printing plate having at least an undercoat layer, a silver halide emulsion layer and a physical development nuclei layer on the support in this order.

3. The process according to claim 1, wherein the support of the lithographic printing plate is roughened and anodized aluminum and the lithographic printing plate further has a physical development nuclei between the support and the silver halide emulsion layer.

4. The process according to claim 1, wherein the silver halide emulsion layer comprises 70 mol % or more of silver chloride.

5. The process according to claim 1, wherein the silver halide emulsion layer contains a chemically sensitized silver halide emulsion.

6. The process according to claim 1, wherein the silver halide emulsion layer contains a silver halide emulsion containing an iridium salt.

7. The process according to claim 1, wherein the silver halide emulsion layer contains an unsensitized dye or pigment mainly absorbing light at about 450 nm to about 600 nm.

8. The process according to claim 3, wherein a protective layer containing an unsensitized dye or pigment mainly absorbing light at about 450 nm to about 600 nm is provided on the silver halide emulsion layer.

9. The process according to claim 1, wherein the silver halide emulsion layer contains at least one of sensitizing dyes represented by the following formulae (I), (II) and (III):

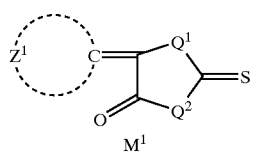

(I)

wherein $Z^1$ represents a group of atoms necessary for forming a 5- or 6-membered nitrogen-containing heterocyclic ring, Q1 represents O, S, $NR^{11}$ or CO—$NR^{12}$, and $Q^2$ represents O, S or $NR^{13}$, where $R^{11}$, $R^{12}$ and $R^{13}$ may be the same or different from each other and each represents a hydrogen atom, an alkyl group, or an aryl group, and M1 represents a counter ion for neutralizing an electric charge of the molecule,

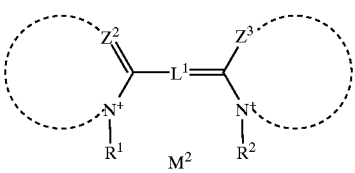

(II)

wherein $Z^2$ and $Z^3$ each represents a group of atoms necessary for forming a 5- or 6-membered nitrogen-containing heterocyclic ring, provided that both of $Z^2$ and $Z^3$ do not contain a sulfur atom simultaneously, $R^1$ and $R^2$ may be the same or different from each other and each represents an alkyl group, $L^1$ represents a methyne group, and $M^2$ represents a counter ion for neutralizing an electric charge of the molecule,

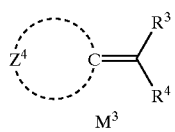

(III)

wherein $Z^4$ represents a group of atoms necessary for forming a 5- or 6-membered nitrogen-containing heterocyclic ring, $R^3$ and R4 may be the same or different from each other and each represents an alkyl group, an alkoxycarbonyl group, an aryloxycarbonyl group, an alkylsulfonyl group, an arylsulfonyl group, an acyl group or a cyano group, and $M^3$ represents a counter ion for neutralizing an electric charge of the molecule.

10. A process for making a lithographic printing plate, which comprises subjecting a lithographic printing material having at least a silver halide emulsion layer containing at least one of sensitizing dyes represented by the following formulae (I), (II) and (III):

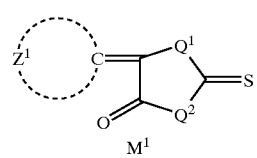

(I)

wherein $Z^1$ represents a group of atoms necessary for forming a 5- or 6-membered nitrogen-containing heterocyclic ring, $Q^1$ represents O, S, $NR^{11}$ or CO—$NR^{12}$, and $Q^2$ represents O, S or $NR^{13}$, where $R^{11}$, $R^{12}$ and $R^{13}$ may be the same or different from each other and each represents a hydrogen atom, an alkyl group, or an aryl group, and $M^1$ represents a counter ion for neutralizing an electric charge of the molecule,

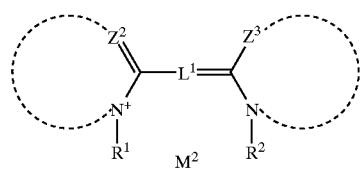

(II)

wherein $Z^2$ and $Z^3$ each represents a group of atoms necessary for forming a 5- or 6-membered nitrogen-containing heterocyclic ring, provided that both of $Z^2$ and $Z^3$ do not contain a sulfur atom simultaneously, $R^1$ and $R^2$ may be the same or different from each other and each represents an alkyl group, $L^1$ represents a methyne group, and $M^2$ represents a counter ion for neutralizing an electric charge of the molecule,

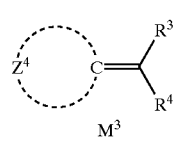

(III)

wherein $Z^4$ represents a group of atoms necessary for forming a 5- or 6-membered nitrogen-containing heterocyclic ring, $R^3$ and $R^4$ may be the same or different from each other and each represents an alkyl group, an alkoxycarbonyl group, an aryloxycarbonyl group, an alkylsulfonyl group, an arylsulfonyl group, an acyl group or a cyano group, and $M^3$ represents a counter ion for neutralizing an electric charge of the molecule, and a physical development nuclei layer on a support to scanning exposure by a scanning type exposure device on which a violet laser diode is mounted, and then subjecting to developing treatment, wherein the silver halide emulsion layer contains an organic desensitizing agent in which a sum of a positive electrode potential and a negative electrode potential of a polarograph is positive.

11. The process according to claim 10, wherein the lithographic printing plate is a lithographic printing plate having at least an undercoat layer, a silver halide emulsion layer and a physical development nuclei layer on the support in this order.

12. The process according to claim 10, wherein the support of the lithographic printing plate is roughened and anodized aluminum and the lithographic printing plate further has a physical development nuclei between the support and the silver halide emulsion layer.

13. The process according to claim 10, wherein the silver halide emulsion layer comprises 70 mol % or more of silver chloride.

14. The process according to claim 10, wherein the silver halide emulsion layer contains a chemically sensitized silver halide emulsion.

15. The process according to claim 10, wherein the silver halide emulsion layer contains a silver halide emulsion containing an iridium salt.

16. The process according to claim 10, wherein the silver halide emulsion layer contains an unsensitized dye or pigment mainly absorbing light at about 450 nm to about 600 nm.

17. The process according to claim 12, wherein a protective layer containing an unsensitized dye or pigment mainly absorbing light at about 450 nm to about 600 nm is provided on the silver halide emulsion layer.

* * * * *